(12) United States Patent
Kohno et al.

(10) Patent No.: US 6,274,966 B1
(45) Date of Patent: *Aug. 14, 2001

(54) PIEZOELECTRIC ACTUATOR (75) Inventors: Yoshiaki Kohno, Moriyama; Hiroshi Nakatani, Omihachiman; Toshiaki Kaji, Kyoto, all of (JP)

(73) Assignee: Murata Manufacturing, Co., LTD, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,699

(22) Filed: Sep. 1, 1998

(30) Foreign Application Priority Data

Sep. 2, 1997 (JP) .................................... 9-236651

(51) Int. Cl.$^7$ .................................... H01L 41/04
(52) U.S. Cl. .................... 310/328; 310/330; 310/340; 310/354; 310/366
(58) Field of Search .................... 310/328, 330–332, 310/346, 366, 358, 359

(56) References Cited

U.S. PATENT DOCUMENTS

| | | | |
|---|---|---|---|
| 4,443,729 | * | 4/1984 | Rider ................. 310/332 X |
| 4,633,120 | * | 12/1986 | Sato et al. ............. 310/366 X |
| 4,678,957 | * | 7/1987 | Harnden et al. .......... 310/332 |
| 4,812,698 | * | 3/1989 | Chida et al. ............ 310/330 |
| 5,126,618 | * | 6/1992 | Takahashi et al. ........ 310/346 |
| 5,266,862 | * | 11/1993 | Ohya .................. 310/366 X |
| 5,381,171 | * | 1/1995 | Hosono ................ 310/328 X |
| 5,438,232 | * | 8/1995 | Inoue et al. ........... 310/366 X |
| 5,446,485 | * | 8/1995 | Usui et al. ............ 310/368 X |
| 5,617,127 | * | 4/1997 | Takeuchi et al. ........ 310/328 X |
| 5,793,149 | * | 8/1998 | Thiel et al. ........... 310/366 X |
| 5,841,216 | * | 11/1998 | Fransen et al. .......... 310/328 |

FOREIGN PATENT DOCUMENTS 0 703 078 A2  3/1996  (EP) .

OTHER PUBLICATIONS

Patent Abstract of Japan vol. 095 No. 010, Nov. 30, 1995 & JP 07 1789802 A (Seiko Epson Corp), Jul. 18, 1995.

* cited by examiner

*Primary Examiner*—MArk O. Budd
(74) *Attorney, Agent, or Firm*—Keating & Bennett, LLP

(57) ABSTRACT

A piezoelectric actuator is constructed to have a displacement value caused by bending to be added to a usual $d_{31}$ component displacement, thereby increasing the total amount of displacement of the actuator. The actuator includes an actuator body having a layered structure of piezoelectric layers and internal electrodes, and external electrodes disposed on an external surface of the actuator body at both ends thereof. One of the outermost piezoelectric layers is made piezoelectrically active as a result of making an extension portion of the first external electrode, through the one of the outermost piezoelectric layers, face the inner electrodes, to have a polarity which is different from that of the extension portion, while a second of outermost piezoelectric layers is made piezoelectrically inactive as a result of either making an extension portion of the second external electrode facing, through the second of the outermost piezoelectric layers, the inner electrodes, to have a polarity which is identical to that of the extension portion of the second external electrode or as a result of not forming an extension portion on the outer electrode.

20 Claims, 5 Drawing Sheets

PIEZOELECTRIC ACTUATOR

BACKGROUND OF THE INVENTION

1. Field of the Invention

The present invention relates to a piezoelectric actuator, and, more particularly, to an improvement in a $d_{31}$ type layered piezoelectric actuator which generates a large displacement.

2. Description of the Related Art

Figure 8:
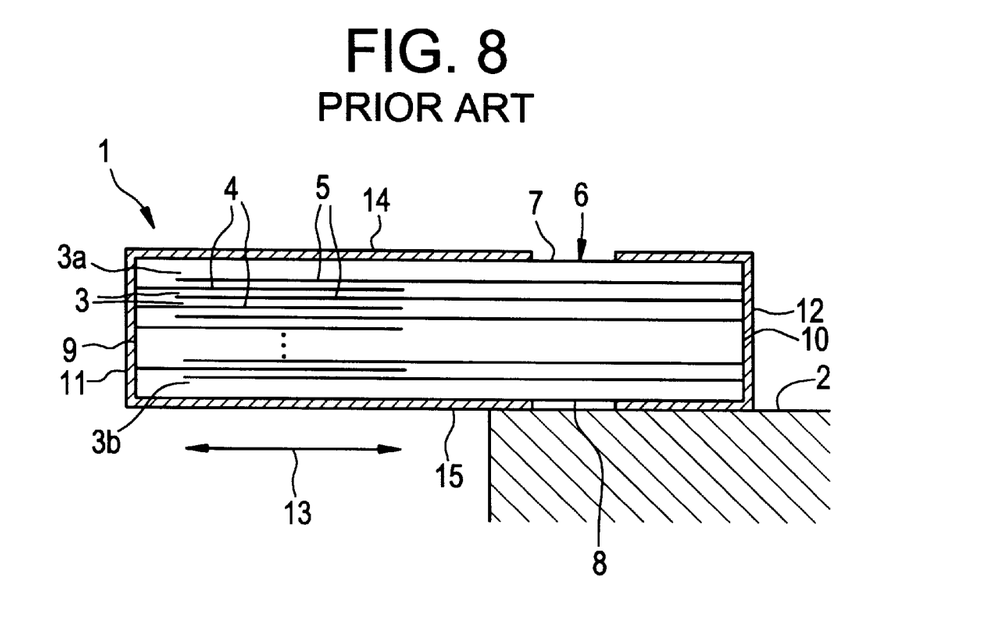
FIG. 8, which corresponds to FIG. 1, is a view showing a conventional $d_{31}$ type piezoelectric actuator 1 which is relevant to the present invention.

A conventional $d_{31}$ type layered piezoelectric actuator 1, which is related to the present invention, is shown in FIG. 8. The $d_{31}$ type layered piezoelectric actuator 1 is planar and substantially rectangular. One end of the actuator 1 is fixed to a fixing portion 2 such as a base and the other end of the actuator 1 is unsupported and free to experience displacement.

The piezoelectric actuator 1 includes an actuator body 6 having a layered structure including a plurality of piezoelectric layers 3 and a plurality of inner electrodes 4 and 5 that are disposed between the piezoelectric layers 3. The actuator body 6 has a first major surface 7 and a second major surface 8, as well as, a first end surface 9 and a second end surface 10. The first and second major surfaces 7 and 8 are defined by the outwardly facing major surfaces of the two piezoelectric layers 3a and 3b that form the outermost layers of the actuator body 1. The end surfaces 9 and 10 are defined by the end surfaces of the plurality of piezoelectric layers 3.

A first external electrode 11 and a second external electrode 12 are disposed on the first end surface 9 and the second end surface 10 of the actuator body 6, respectively. In order to actuate the piezoelectric actuator, a voltage is applied to the first and the second external electrodes 11 and 12 from outside of the actuator body 6.

The aforementioned inner electrodes 4 are referred to as first inner electrodes 4 and are connected to the first external electrode 11 on the first end surface 9. The inner electrodes 5 are referred to as second inner electrodes 5 and are connected to the second external electrode 12 on the second end surface 10. Applying a voltage to the external electrodes 11 and 12 causes the first inner electrodes 4 and the second inner electrodes 5 to have different polarities. The first inner electrodes 4 and the second inner electrodes 5 are alternately disposed in the direction in which they are stacked upon each other.

At the side of the first end surface 9 of the actuator body 6, a piezoelectrically active area 13 is defined by stacking the first inner electrodes 4 and the second inner electrodes 5 upon each other. The piezoelectrically active area 13 is located closer to the free end of the actuator 1 than the fixed end of the actuator attached to the fixing portion 2. At the side of the second end surface 10 of the actuator body 6, a piezoelectrically inactive area is defined and has a size or area which is equal to the fixing area to be fixed to the fixing portion 2. The fixing area is fixed so that the piezoelectric actuator 1 is not dislodged or removed from the fixing portion 2 when the actuator body 6 is undergoing displacement.

For the purpose of increasing displacement, the piezoelectric layers 3a and 3b, being the outer most layers of the illustrated piezoelectric actuator 1, are formed so as to be piezoelectrically active within at least the piezoelectric active area 13. More specifically, the first external electrode 11 has an extension portion 14 and an extension portion 15 which extend to the first major surface 7 and the second major surface 8, respectively, with the extension portion 14 facing, through the piezoelectric layer 3a at the first major surface 7 side, the second inner electrodes 5 having a polarity which is different from that of the first outer electrode 11, and the extension portion 15 facing, through the piezoelectric layer 3b at the second major surface 8 side, the second inner electrodes 15.

Figure 9:
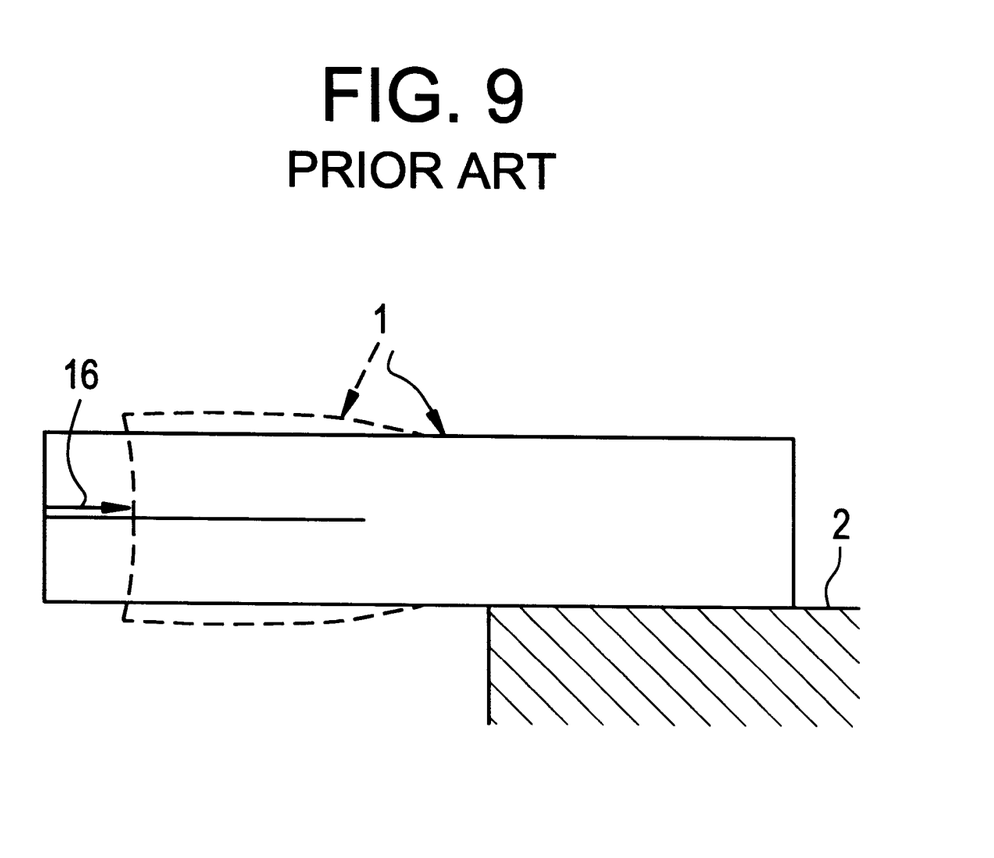
FIG. 9, which corresponds to FIG. 2, is a view showing a displacement of the piezoelectric actuator 1 of FIG. 8.

The displacement of the piezoelectric actuator 1 is shown in FIG. 9. In FIG. 9, the piezoelectric actuator 1 is deformed to the shape indicated by broken lines, causing displacement shown by arrow 16 at one end portion of the piezoelectric actuator 1.

The above-described piezoelectric actuator, though displaced by only a small amount, is displaced easily and quickly. As a result, the actuator can be advantageously used in inkjet printers. However, when a high-performance printer is to be provided, it is necessary to discharge ink in large amounts. In such a case, an actuator which can is arranged to experience a large displacement is desired.

To achieve such an actuator, it has been attempted to develop a new material having a large $d_{31}$ constant to produce a highly efficient $d_{31}$ type actuator. However, even this piezoelectric actuator does not provide sufficient performance or large enough displacement. In addition, in developing the new material having a large $d_{31}$, considerable effort and time are required to increase the $d_{31}$ constant by only a few percent.

SUMMARY OF THE INVENTION

In order to overcome the problems described above, the preferred embodiments of the present invention provide a piezoelectric actuator which can very easily be displaced by a larger amount without relying on the development of a new material.

In a preferred embodiment of the present invention, a $d_{31}$ type layered piezoelectric actuator includes an actuator body having a layered structure including a plurality of piezoelectric layers and a plurality of inner electrodes disposed between the piezoelectric layers. The actuator body has a first major surface and a second major surface, as well as, a first end surface and a second end surface. The first and second major surfaces are defined by outwardly facing major surfaces of the two piezoelectric layers which are the outermost layers of the actuator body. The first and the second end surfaces are defined by the end surfaces of the piezoelectric layers The piezoelectric actuator also includes a first external electrode and a second external electrode, which are located on at least the first end surface and the second end surface of the actuator body. The inner electrodes include first inner electrodes which are connected to the first external electrode on the first end surface and second inner electrodes which are connected to the second external electrode on the second end surface. The first inner electrodes and the second inner electrodes are alternately disposed in a direction in which they are stacked upon each other. The actuator body has a piezoelectrically active area defined by placing the first inner electrodes and the second inner electrodes upon each other. The first external electrode has an extension portion which extends to the first major surface of the actuator body. In the piezoelectrically active area, the second inner electrodes face, through the piezoelectric layer that is the outermost layer at the first major surface side, the extension portion of the first external electrode, whereby the piezoelectric layer that is the outermost layer at the first major surface side becomes piezoelectrically active, so that a large displacement occurs. The piezoelectric layer that is the outermost layer at the second major surface side is piezoelectrically inactive.

Therefore, the displacement value caused by bending is added to the $d_{31}$ component displacement, making it possible to increase the efficiency of displacement and to increase the displacement amount as a whole.

Accordingly, when the piezoelectric actuator of preferred embodiments of the present invention is applied, for example, to an inkjet printer, a larger amount of ink can be discharged, resulting in improved printer performance.

In the above described piezoelectric actuator, when either one of the first external electrode and the second external electrode has an extension portion which extends to the second major surface, the piezoelectric layer that is the outermost layer at the second major surface side is piezoelectrically inactive. Therefore, when, at the piezoelectrically active area, the inner electrodes, with the same polarity as the external electrode having the extension portion which extends to the second major surface, faces the extension portion which extends to the second major surface, the piezoelectric layer which is the outermost layer at the second major surface side can be reliably made piezoelectrically inactive, since the inner electrodes and the facing extension portion of the external electrode have the same polarity.

In addition, when the first and second external electrodes are not disposed on the second major surface, in the piezoelectrically active area, causing the piezoelectric layer which is the outermost layer at the second major surface side to become piezoelectrically inactive, the piezoelectric layer, which is the outermost layer at the second major surface side, is reliably made piezoelectrically inactive, regardless of the polarity of the inner electrodes disposed inwardly along the piezoelectric layer which is the outermost layer at the second major surface side.

Further, when the actuator body is arranged such that it has a piezoelectrically active area at one end thereof and a piezoelectrically inactive area at the other end, with the piezoelectrically inactive area being a fixing area to be fixed to a fixing portion, it is possible to prevent the piezoelectric actuator from separating from the fixing portion when the actuator body is undergoing displacement. Separation from the fixing portion tends to occur in piezoelectric actuators, such as the piezoelectric actuator according to preferred embodiments of the present invention, in which the entire displacement is greatly increased as a result of being bent. Therefore, arranging the actuator body in such a manner as described above is particularly effective in preventing separation from the fixing portion in such piezoelectric actuators.

Other features and advantages of the present invention will become apparent from the following description of the invention which refers to the accompanying drawings.

DETAILED DESCRIPTION OF PREFERRED EMBODIMENTS

Figure 1:
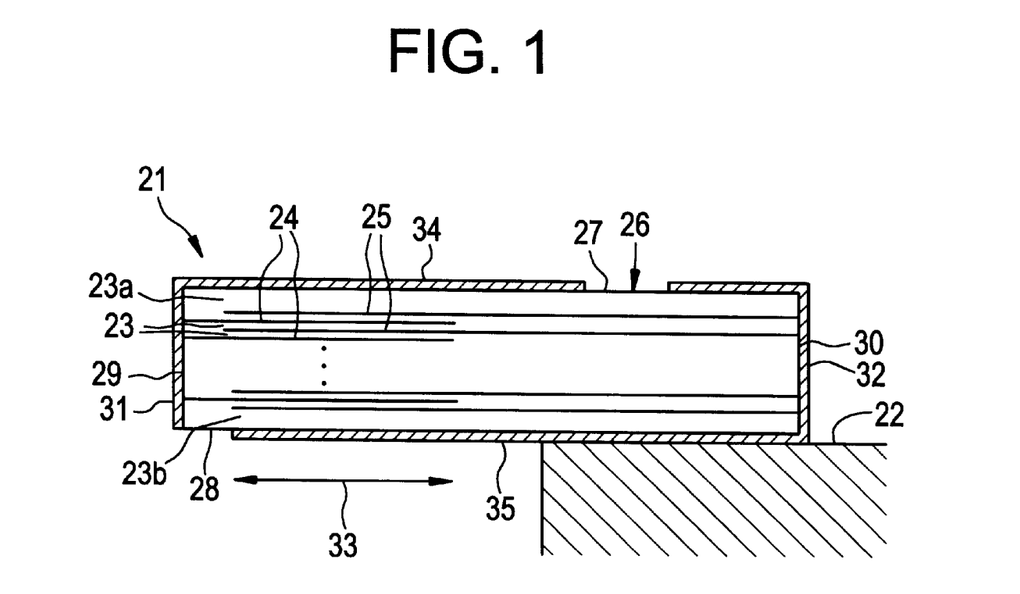
FIG. 1 is a cross-sectional view of a $d_{31}$ type layered piezoelectric actuator mounted on a fixing portion in a preferred embodiment of the present invention.

FIG. 1, which corresponds to FIG. 8, is a view showing a $d_{31}$ type layered piezoelectric actuator 21 in a preferred embodiment in accordance with the present invention.

As described below, the piezoelectric actuator 21 and the piezoelectric 1 of FIG. 8 share certain common features.

The piezoelectric actuator 21 shown in FIG. 1 is preferably planar and substantially rectangular. One end of the piezoelectric actuator 21 is fixed to a fixing portion 22 such as a base and the other end of the piezoelectric actuator 21 is free and unsupported so as to experience unhindered displacement.

The piezoelectric actuator 21 has an actuator body having a layered structure including a plurality of piezoelectric layers 23 and a plurality of inner electrodes 24 and 25 that are located between the piezoelectric layers 23. Each piezoelectric layer 23 is preferably made of a piezoelectric ceramic material such as a PZT type ceramic material (lead titanate zirconate), and each of the inner electrodes 24 and 25 is made of, for example, Ag/Pd. One piezoelectric layer 23 is, for example, about 20 µm thick, whereas one inner electrode 24 and one inner electrode 25 are, for example, about 2 µm thick.

The actuator body 26 is usually formed, by an integrating firing process, into a body having a first major surface 27 and a second major surface 28, as well as, a first end surface 29 and a second end surface 30. The first and second major surfaces 27 and 28, respectively, are defined by the outwardly facing major surfaces of two piezoelectric layers 23a and 23b that define the outermost layers of the actuator body 26. The first and second end surfaces 29 and 30 are defined by the end surfaces of the plurality of piezoelectric layers 23.

A first external electrode 31 and a second external electrode 32 are disposed on the first end surface 29 and the second end surface 30 of the actuator body 26, respectively. The external electrodes 31 and 32 are preferably composed of a plurality of thin film electrode sections made of Cr, Au, or the like. In order to actuate the piezoelectric actuator 21, a voltage is applied to the first and the second external electrodes 31 and 32 from outside of the actuator body 26.

The inner electrodes 24 are first inner electrodes 24 that are connected to the first external electrode 31 on the first end surface 29. The inner electrodes 25 are second inner electrodes 25 which are connected to the second external electrode 32 on the second end surface 30. Therefore, applying a voltage to the external electrodes 31 and 32 causes the first inner electrodes 24 and the second inner electrodes 25 to have different polarities. The first inner electrodes 24 and the second inner electrodes 25 are alternately disposed in a direction in which they are stacked upon each other.

At the side of the first end surface 29 of the actuator body 26, a piezoelectrically active area 33 is defined by placing the first inner electrodes 24 and the second inner electrodes 25 upon each other. At the side of the second end surface 30 of the actuator body 26, a piezoelectrically inactive area is defined and preferably has a size that corresponds to the fixing area to be fixed to the fixing portion 22. The fixing area is fixed so that the actuator body 26 is not dislodged or removed from the fixing portion 22 when the actuator body 26 is undergoing displacement.

At the piezoelectrically active area 33, the first outer electrode 31 has an extension portion 34 which extends to the first major surface 27 and faces, through the piezoelectric layer 23a which is the outermost layer at the side of the first major surface 27, the second inner electrodes 25. The second inner electrodes 25 have a polarity that is different from that of the first external electrode 31, so that the piezoelectric layer 32a is piezoelectrically active.

Accordingly, the above-described piezoelectric actuator 21 according to preferred embodiments of the present invention shown in FIG. 1 and the piezoelectric actuator 1 of FIG. 8 share common features.

In the present preferred embodiment shown in FIG. 1, the first outer electrode 31 does not extend to the second major surface 28, whereas the second outer electrode 32 has, at the piezoelectrically inactive area 33, an extension portion 35 that extends to the second surface 28. The extension portion 35 faces the second inner electrodes 25 through the piezoelectric layer 23b which is the outermost layer at the second major surface 28 side. Since the second inner electrodes 25 have the same polarity as the second external electrode 32, the piezoelectric layer 23b is piezoelectrically inactive.

Figure 2:
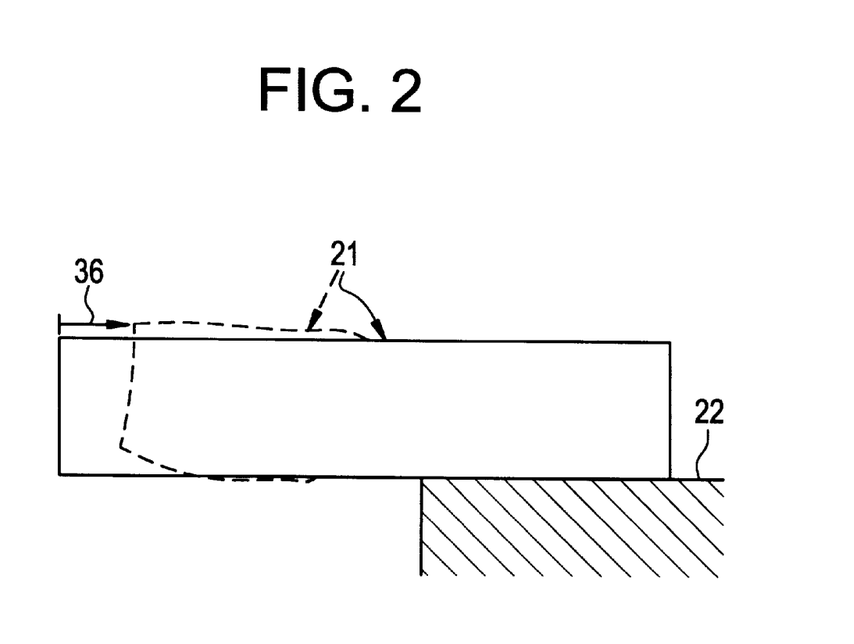
FIG. 2 is a front view illustrating a displacement of the piezoelectric actuator shown in FIG. 1.

FIG. 2, which corresponds to FIG. 9, illustrates a displacement of the piezoelectric actuator 21. As indicated by the broken lines of FIG. 2, the piezoelectric actuator 21 bends when it is being deformed, causing a displacement, shown by arrow 36, of an end portion of the piezoelectric actuator 21. Such bending of the piezoelectric actuator 21 occurs when the piezoelectric layer 23b, which becomes piezoelectrically inactive, does not deform piezoelectrically. Accordingly, in the piezoelectric actuator 21, when displacement caused by bending is added to the $d_{31}$ component displacement, the overall displacement 36 occurs more efficiently and is greater than the usual $d_{31}$ component displacement 16 illustrated in FIG. 9, so a large displacement occurs in the actuator 21.

Although in the preferred embodiment shown in FIG. 1 the second outer electrode 32 was the electrode having the extension portion 35 that extends to the second major surface 28, in other preferred embodiments, the first outer electrode 31 may be the electrode having the extension portion that extends to the second major surface 28. In this case, selection of the arrangement of the inner electrodes 24 and 25 may be made such that the first inner electrodes 24, having the same polarity as the first outer electrode 31, faces, through the piezoelectric layer 23b which is the outermost layer at the second major surface 28 side, the extension portion of the first outer electrode 31.

Based on the displacement simulation results of the piezoelectric actuator 21 using the finite element method (FEM), a comparison is made between the preferred embodiment of the piezoelectric actuator 21 of FIG. 1 in accordance with the present invention and the conventional piezoelectric actuator 1 of FIG. 8.

Figure 3:
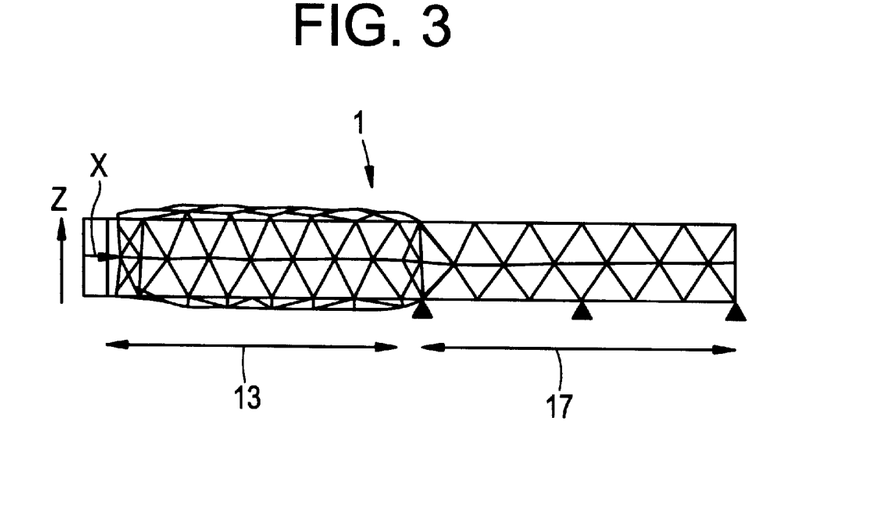
FIG. 3 is a view showing a displacement of a conventional piezoelectric actuator 1 shown in FIG. 8, based on FEM simulation.
Figure 4:
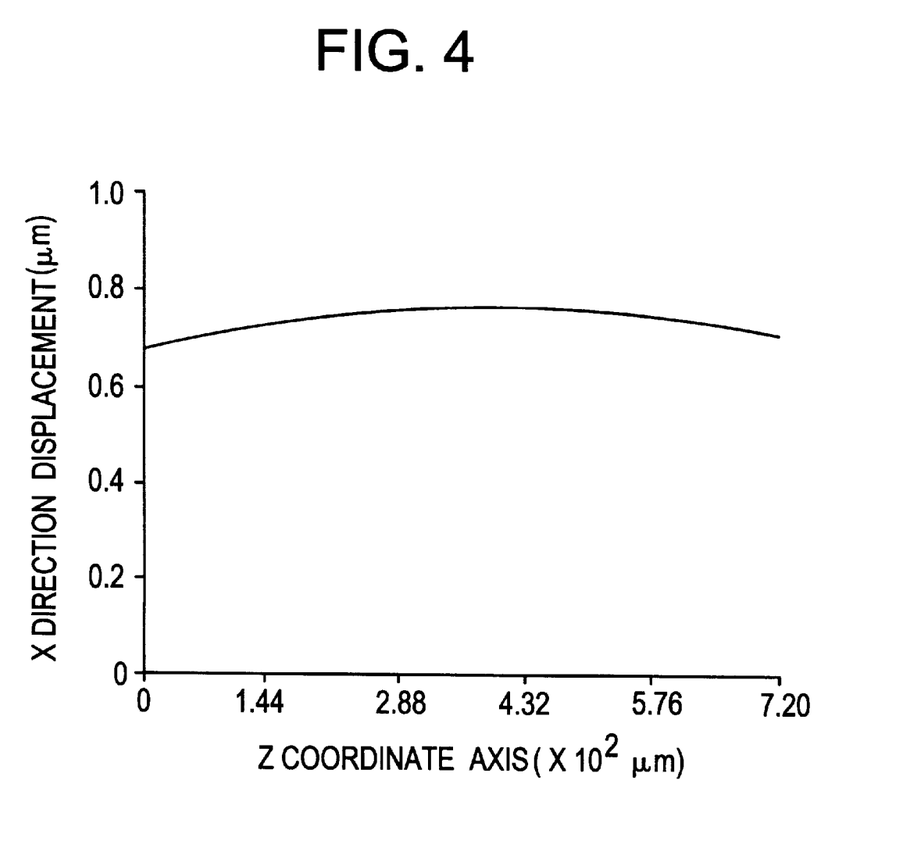
FIG. 4 is a graph showing the distribution of the amount of displacement of one end of the piezoelectric actuator 1 in the X direction and in the Z direction, based on the results of the FEM simulation illustrated in FIG. 3.

FIG. 3 is a view showing a displacement occurring in the conventional piezoelectric actuator 1, based on FEM simulation results, while FIG. 4 is a graph showing the distribution in the amount of displacement of one end portion of the piezoelectric actuator 1 in the X direction and in the Z direction, when a voltage, with a frequency of $1.000000 \times 10^3$ Hz, is applied to the outer electrodes 11 and 12. It is to be noted that the X direction and the Z direction are indicated in FIG. 3. The fixing area 17 to be fixed to the fixing portion 2 is also shown in FIG. 3.

In the FEM simulation, the overall length of the piezoelectric actuator 1 is about 7 mm, the length of the piezoelectric active area 33 is about 2.5 mm, the length and the thickness of the fixing area 17 are about 4 mm and about 0.72 mm, respectively.

As shown in FIG. 3, one end portion of the conventional piezoelectric actuator 1 essentially deforms only in the X direction, with the maximum displacement of the one end portion thereof being 0.76 μm, as shown in FIG. 4.

Figure 5:
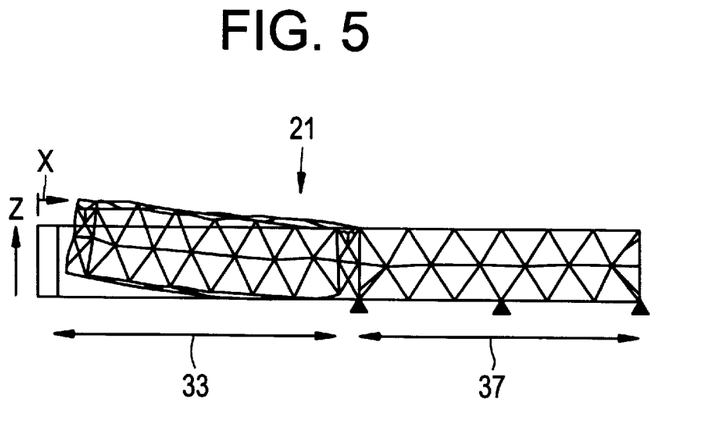
FIG. 5 is a view showing a displacement of the piezoelectric actuator shown in FIG. 1, based on FEM simulation.
Figure 6:
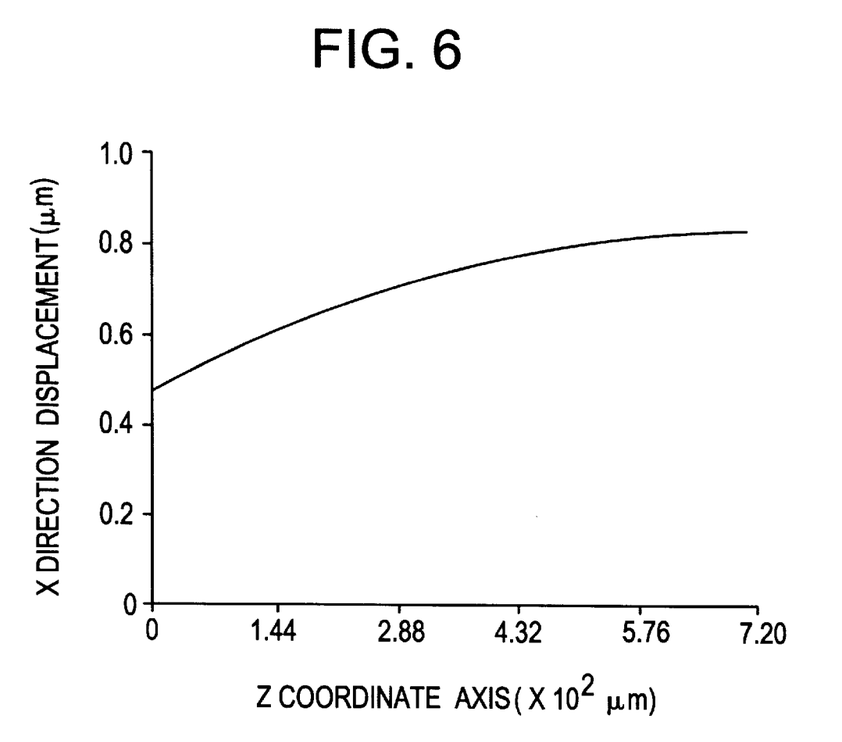
FIG. 6 is a graph showing the distribution of the amount of displacement of one end of the piezoelectric actuator in the X direction and in the Z direction, based on the results of the FEM simulation illustrated in FIG. 5.

FIG. 5, which corresponds to FIG. 3, is a view showing a displacement occurring in the piezoelectric actuator 21 of the preferred embodiment of the present invention, whereas FIG. 6, which corresponds to FIG. 4, is a graph showing the amount of displacement of one end portion of the piezoelectric actuator 21 in the X direction. It is to be noted that FIG. 5 shows the fixing area 37 to be fixed to the fixing portion 22.

As shown in FIG. 5, one end portion of the piezoelectric actuator 21 of the present preferred embodiment deforms not only in the X direction, but also in the Z direction, with the maximum amount of displacement of the one end portion in the X direction being about 0.82 μm as shown in FIG. 6, which is about 8% larger than the conventional maximum displacement amount shown in FIG. 4. Since the overall bending effect in increasing the efficiency with which displacement occurs is greater than the effect in reducing this efficiency which is caused by the piezoelectric layer 23b becoming piezoelectrically inactive, the amount of displacement is increased.

For example, in the case where the piezoelectric actuator 21 of the present preferred embodiment is used in an inkjet printer, when the bending becomes too large, causing a large amount of displacement in the Z direction, the direction in which ink is discharged tends to vary. Therefore, for specific applications, it is necessary to consider the amount of bending.

Figure 7:
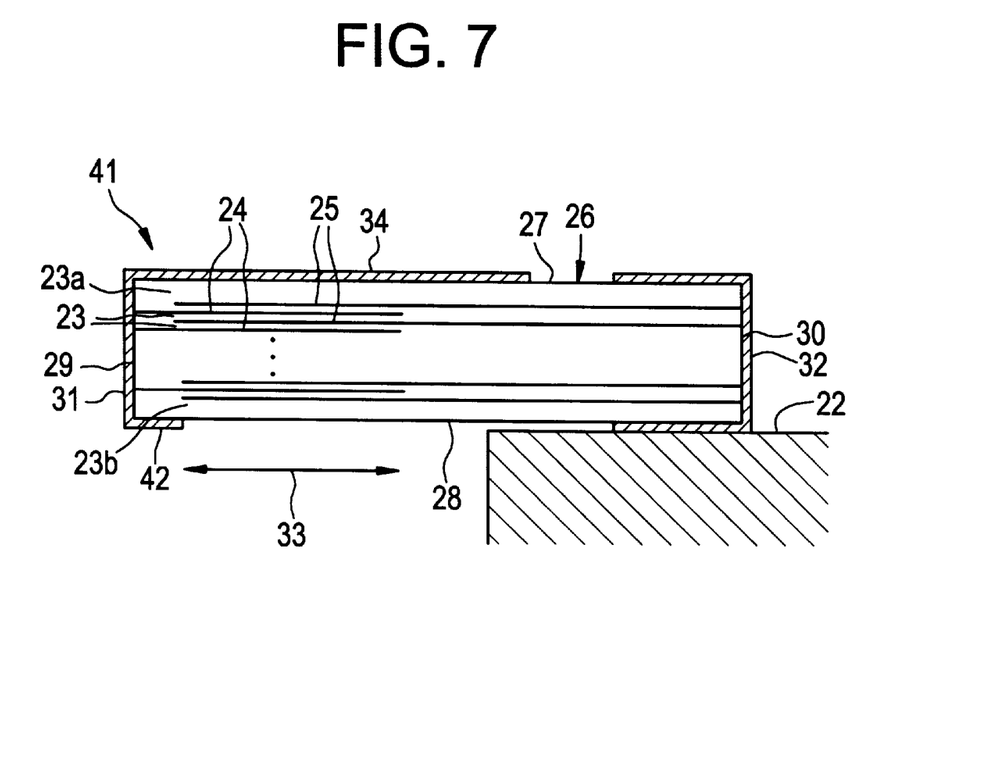
FIG. 7, which corresponds to FIG. 1, is a view showing a $d_{31}$ type layered piezoelectric actuator 41, according to another preferred embodiment of the present invention.

FIG. 7, which corresponds to FIG. 1, is a view showing a piezoelectric actuator 41 according to another preferred embodiment of the present invention. In FIG. 7, corresponding parts to those of FIG. 1 are given the same reference numerals and descriptions of these similar elements are not repeated below.

In the preferred embodiment illustrated in FIG. 7, both the first outer electrode 31 and the second outer electrode 32 are not disposed on a second major surface 28, at a piezoelectrically active area 33, causing a piezoelectric layer 23b at the second major surface 28 side to be piezoelectrically inactive.

In FIG. 7, a space is formed between an actuator body 26 and a fixing portion 22 and is the same size as the thickness of the second outer electrode 32. The space is filled with an adhesive used for fixing the piezoelectric actuator 41 to the fixing portion 22.

Similar to the piezoelectric actuator 21 of FIG. 1, it has been confirmed that the piezoelectric actuator 41 of the present preferred embodiment undergoes displacements such as those shown in FIGS. 2 and 5, and has the displacement values and the displacement amount distribution shown in FIG. 6.

Although in FIG. 7 the inner electrodes that are placed directly above the piezoelectric layer 23b at the second major surface 28 side are the second inner electrodes 2S that have the same polarity as the second external electrode 32, the first inner electrodes 24 that have the same polarity as the first external electrode 31 may be placed directly thereabove instead of the second inner electrodes 25.

In the structure of FIG. 7, the first outer electrode 31 has an extension portion 42 which extends to the second major surface 28, with one end portion of the extension portion 42 being located slightly within the piezoelectrically active area 33, so that one end portion of the extension portion 42, through the piezoelectric layer 23b, faces only a very small portion of the second inner electrodes which have a polarity which is different from that of the extension portion 42. Making one end portion of the extension portion 42 face only a very small portion of the second inner electrodes is not sufficient to make the piezoelectric layer 23b piezoelectrically active. Accordingly, it is to be understood that a preferred embodiment in which either the first external electrode 31 or the second external electrode 32 is formed along only a very small portion of the second major surface 28 falls within the scope of the present invention.

While the invention has been particularly shown and described with reference to preferred embodiments thereof, it will be understood by those skilled man in the art that the forgoing and other changes in form and details may be made therein without departing from the spirit of the invention.

What is claimed is:

1. A $d_{31}$ type piezoelectric actuator, comprising:
   an actuator body having a laminated structure including a plurality of piezoelectric layers and a plurality of inner electrodes disposed between said piezoelectric layers, said actuator body having a first major surface, a second major surface, a first end surface and a second end surface, said first major surface and said second major surface being defined by outwardly facing major surfaces of two of the plurality of piezoelectric layers which are outermost layers among the piezoelectric layers, said first end surface and said second end surface being defined by the end surfaces of said piezoelectric layers, said actuator body including a piezoelectrically active region;
   a first external electrode and a second external electrode provided on at least said first end surface and said second end surface, respectively;
   said inner electrodes including first inner electrodes connected to said first external electrode at said first end surface and second inner electrodes connected to said second external electrode at said second end surface, said first inner electrodes and said second inner electrodes being alternately disposed in a direction in which said first and said second inner electrodes are laminated to each other so at to define said active region;
   said first external electrode having an extension portion which extends to said first major surface; and
   said second inner electrodes facing said extension portion of said first external electrode in said piezoelectrically active region through said piezoelectric layer, which is the outermost layer at a location of said first major surface, whereby said piezoelectric layer at said location of said first major surface and at an area of said active region is piezoelectrically active, and said second inner electrode which is outermost at a location of said second major surface has the same polarity as said second external electrode such that said piezoelectric layer, which is the outermost layer at a location of said second major surface and at said area of said active region, is piezoelectrically inactive.

2. The piezoelectric actuator according to claim 1, wherein at least one of said first external electrode and said second external electrode has an extention portion which extends to said second major surface; and
   said inner electrode have the same polarity as said external electrode having said extension portion which extends to said second major surface and face said extention portion which extends to said second major surface in said piezoelectrically active region through said piezoeletric layer which is the outermost layer at said location of said second major surface, whereby said piezoelectric layer which is the outermost layer at said location of said second major surface is piezoelectically inactive.

3. The piezoelectric actuator according to claim 1, wherein both of said first and second external electrodes are not provided on said second major surface in said piezoelectally active region, whereby said piezoelectric layer which is the outermost layer at a location said second major surface is piezoelectrically inactive.

4. The piezoelectric actuator according to claim 1, wherein said piezoelectrically active region is located at one end of said actuator body, and a piezoelectrically inactive area at another end of said actuator body, said piezoelectrically inactive area including a fixing area which is arranged to be fixed to a fixing portion.

5. The piezoelectric actuator according to claim 2, wherein said piezoelectrically active region is located at one end of said actuator body and a piezoelectrically inactive area is located at the other end of said actuator body, said piezoelectrically inactive area including a fixing area to be fixed to a fixing portion.

6. A piezoelectric actuator, comprising:
   an actuator body including a plurality of piezoelectric layers and inner electrodes and having a first major surface, a second major surface, a first end surface and a second end surface, said first major surface and said second major surface being defined by outwardly facing major surfaces of two of the plurality of piezoelectric layers which are outermost layers among the piezoelectric layers, said first end surface and said second end surface being defined by the end surfaces of said piezoelectric layers, said actuator body including a piezoelectrically active region;
   a first external electrode and a second external electrode provided on at least said first end surface and said second end surface, respectively; wherein
   one of said piezoelectric layers which is the outermost layer at a location of said first major surface is piezoelectrically active and one of said inner electrodes which is outermost at a location of said second major surface has the same polarity as said second external electrode such that another of said piezoelectric layers which is the outermost layer at a location of said second major surface is piezoelectrically inactive at an area of said active region.

7. The piezoelectric actuator according to claim 6, wherein said first end of said actuator body having said first external electrode disposed thereon is a free end and said second end of said actuator body having said second external electrode disposed thereon is a fixed end which is attached to a fixing member, said second external electrode including an extension portion which extends to said second major surface of said actuator body adjacent the first end of said actuator body.

8. The piezoelectric actuator according to claim 7, wherein said extension portion of said second external electrode extending to said piezoelectrically active region.

9. The piezoelectric actuator according to claim 6, wherein said inner electrodes include first inner electrodes connected to said first external electrode at said first end surface and second inner electrodes connected to said second external electrode at said second end surface, said first inner electrodes and said second inner electrodes being alternately disposed in a direction in which said first and said second inner electrodes are laminated to each other.

10. The piezoelectric actuator according to claim 6, wherein said actuator body has a laminated structure including said plurality of piezoelectric layers and said plurality of inner electrodes disposed between said piezoelectric layers.

11. The piezoelectric actuator according to claim 6, wherein at least one of said first external electrode and said second external electrode has an extension portion which extends to said second major surface.

12. The piezoelectric actuator according to claim 11, wherein said inner electrodes have the same polarity as said external electrode having said extension portion which extends to said second major surface and face said extension portion which extends to said second major surface in said piezoelectrically active region through said piezoelectric layer which is the outermost layer at said location of said second major surface, whereby said piezoelectric layer which is the outermost layer at said location of said second major surface is piezoelectrically inactive.

13. The piezoelectric actuator according to claim 6, wherein both of said first and second external electrodes are not provided on said second major surface in said piezoelectrically active region, whereby said piezoelectric layer which is the outermost layer at a location of said second major surface is piezoelectrically inactive.

14. The piezoelectric actuator according to claim 13, wherein said piezoelectrically active region is located at one end of said actuator body, and a piezoelectrically inactive area at another end of said actuator body, said piezoelectrically inactive area including a fixing area which is arranged to be fixed to a fixing portion.

15. A piezoelectric actuator, comprising:
an actuator body including a plurality of piezoelectric layers and a plurality of inner electrodes and having a first major surface, a second major surface, a first end surface and a second end surface, said first major surface and said second major surface being defined by outwardly facing major surfaces of two of the plurality of piezoelectric layers which are outermost layers among the piezoelectric layers, said first end surface and said second end surface being defined by the end surfaces of said piezoelectric layers, said actuator body including a piezoelectrically active region, said active region having at least one of said outermost layers being piezoelectrically inactive in an area of said active region;

a first external electrode and a second external electrode provided on at least said first end surface and said second end surface, respectively; wherein said first end of said actuator body having said first external electrode disposed thereon is a free end and said second end of said actuator body having said second external electrode disposed thereon is a fixed end which is attached to a fixing member, said second external electrode including an extension portion which extends to said second major surface of said actuator body adjacent the first end of said actuator body, and one of said plurality inner electrodes which is outermost at a location of said second major surface has the same polarity as said second external electrode such that the at least one of said outermost layers is piezoelectyrically inactive in an area of said active region.

16. The piezoelectric actuator according to claim 15, wherein one of said piezoelectric layers which is the outermost layer at a location of said first major surface is piezoelectrically active and another of said piezoelectric layer which is the outermost layer at a location of said second major surface is piezoelectrically inactive.

17. The piezoelectric actuator according to claim 15, wherein said extension portion of said second external electrode extending to said piezoelectrically active region.

18. The piezoelectric actuator according to claim 15, wherein said inner electrodes include first inner electrodes connected to said first external electrode at said first end surface and second inner electrodes connected to said second external electrode at said second end surface, said first inner electrodes and said second inner electrodes being alternately disposed in a direction in which said first and said second inner electrodes are laminated to each other.

19. The piezoelectric actuator according to claim 15, wherein said actuator body has a laminated structure including said plurality of piezoelectric layers and said plurality of inner electrodes disposed between said piezoelectric layers.

20. The piezoelectric actuator according to claim 15, wherein said inner electrodes have the same polarity as said external electrode having said extension portion which extends to said second major surface and face said extension portion which extends to said second major surface in said piezoelectrically active region through said piezoelectric layer which is the outermost layer at said location of said second major surface, whereby said piezoelectric layer which is the outermost layer at said location of said second major surface is piezoelectrically inactive.

* * * * *